(12) United States Patent
Hochstein

(10) Patent No.: US 6,517,218 B2
(45) Date of Patent: Feb. 11, 2003

(54) LED INTEGRATED HEAT SINK

(75) Inventor: Peter A. Hochstein, Troy, MI (US)

(73) Assignee: Relume Corporation, Troy, MI (US)

( * ) Notice: Subject to any disclaimer, the term of this patent is extended or adjusted under 35 U.S.C. 154(b) by 0 days.

(21) Appl. No.: 09/727,726

(22) Filed: Dec. 1, 2000

(65) Prior Publication Data

US 2001/0030866 A1 Oct. 18, 2001

Related U.S. Application Data

(60) Provisional application No. 60/193,796, filed on Mar. 31, 2000.

(51) Int. Cl.[7] ............................................... F21V 29/00
(52) U.S. Cl. ....................... 362/294; 362/800; 257/712; 361/704
(58) Field of Search ................................. 362/294, 373, 362/800, 555, 545; 257/712; 361/704, 705, 712

(56) References Cited

U.S. PATENT DOCUMENTS

| | | | |
|---|---|---|---|
| 4,394,679 A | * 7/1983 | Hawrylo | 257/712 X |
| 4,733,335 A | * 3/1988 | Serizawa et al. | 362/373 X |
| 4,959,761 A | 9/1990 | Critelli et al. | 362/226 |
| 5,186,535 A | 2/1993 | Yokoyama | 362/226 |
| 5,264,998 A | 11/1993 | Bax | 362/226 |
| 5,440,468 A | 8/1995 | Savage, Jr. | 362/226 |
| 5,513,082 A | 4/1996 | Asano | 362/226 |
| 5,782,555 A | 7/1998 | Hochstein | 362/373 |
| 5,785,418 A | 7/1998 | Hochstein | 362/373 |
| 5,857,767 A | 1/1999 | Hochstein | 362/294 |
| 5,975,715 A | 11/1999 | Bauder | 362/226 |
| 6,045,240 A | 4/2000 | Hochstein | 362/294 |

* cited by examiner

Primary Examiner—Stephen Husar
(74) Attorney, Agent, or Firm—Howard & Howard

(57) ABSTRACT

An electrically driven light emitting diode (LED) assembly comprising a light emitting diode (12), first (14) and second (16) electrical leads for conducting electricity to and from the light emitting diode (12), and a heat sink (18). The assembly is characterized by the first lead (14) including the heat sink (18) for conducting electricity and heat from the light emitting diode (12) through the heat sink (18). In other words, the diode (12) conducts electricity through a heat sink (18) allowing the diode (12) to be in electrical conductivity with the heat sink (18).

19 Claims, 2 Drawing Sheets

LED INTEGRATED HEAT SINK

This application claims the benefits of provisional application 60/193,796 filed Mar. 31, 2000.

BACKGROUND OF THE INVENTION

1. Field of the Invention

The subject invention relates to a light emitting diode assembly, and more specifically, to thermal management for conducting thermal energy away from the diode.

2. Description of the Prior Art

Assemblies in the prior art include a light emitting diode (LED) with first and second electrical leads for conducting electricity to and from said light emitting diode, and a heat sink. For several decades the preferred light emitting diode construction was the so-called T13/4 epoxy package. This inexpensive package is more than adequate at relatively low LED power levels. As LED performance levels rose, and the power dissipated within the devices reached a critical level and the self-generated heat within the LED die itself became an important design issue. The well-known behavior of many LED families to substantially dim and degrade at higher operating temperatures drove the need for better thermal management solutions.

Larger LED dies and more efficient, low thermal resistance leads or lead frames filled much of the need for higher performance devices. However, as luminous output increased by substantially increasing device drive current, self-generated heat again became a design issue.

Various dual in-line LED packages provided decent luminous flux at nominal cost for all but the most demanding applications. Unfortunately, it is these more demanding applications that offer the greatest market potential. Outdoor lighting of various kinds, such as automotive exterior lamps, traffic signals, railroad signals, and even advertising signs, are exposed to high ambient operating temperatures. When coupled with the self-generated heat of the LED itself, the resulting die (junction) temperature may quickly degrade the LED, shortening it's life and reducing it's light output. For some safety critical applications such a reduction in luminous output can have dire consequences.

In order to ameliorate these thermally driven problems, LED manufacturers began to manufacture more, thermally capable devices. One such device is designed only for mechanical crimp attachment, as the relatively low thermal resistance of its lead frame may damage the LED die if the device is soldered. Another path to high performance LEDs with aggressive thermal management is exemplified by products which have essentially separated the major heat flow path out of the die from the electrical leads that power the devices. One assembly employs an elegant yet costly bulk diamond insulator to de-couple the die electrically from the integral heat sink post. This plated copper element transfers heat from the die to an external heat dissipater. The use of a bulk (or thin film) diamond insulator is advantageous because of diamond's very high thermal conduction, which is greater than that of copper (400 W/m/"K). Unfortunately, the excellent thermal performance comes at a high price, and such LEDs are typically priced at least an order of magnitude above less sophisticated but nearly comparable 'non diamond' LEDs. Another assembly modifies the existing commercial dual-in-line package to accommodate an Integral heat sink but wherein an electrically non-conductive material must be placed between the diode and the heat sink to make sure no electrical current passes from the diode to the heat sink, e.g., U.S. Pat. No. 5,857,767. While the thermal impedance of this LED is nominally 3.7 times higher than the design with diamond insulation, cost/performance criteria favor this design.

There clearly remains a need for an improvement and modification of the current designs to improve the thermal performance of a non-diamond isolated LED to a level comparable to the costly diamond isolated LED.

SUMMARY OF THE INVENTION AND ADVANTAGES

An electrically driven light emitting diode (LED) assembly comprising a light emitting diode, first and second electrical leads for conducting electricity to and from said light emitting diode, and a heat sink. The assembly is characterized by the first lead including the heat sink for conducting electricity and heat from the light emitting diode through the heat sink.

Also included in the invention is a method of fabricating such an electrically driven light emitting diode (LED) assembly comprising the step of disposing the heat sink in electrical series with the first lead for conducting electricity and heat from the light emitting diode through the heat sink.

Accordingly, the present invention comprises an LED assembly that is constructed with an integral primary heat flow path other than the electrical leads. That heat flow heat sink may be electrically insulated on the outside of the LED when electrical isolation is required by coupling to an electrically conductive heat dissipater.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE PREFERRED EMBODIMENT

Figure 1:
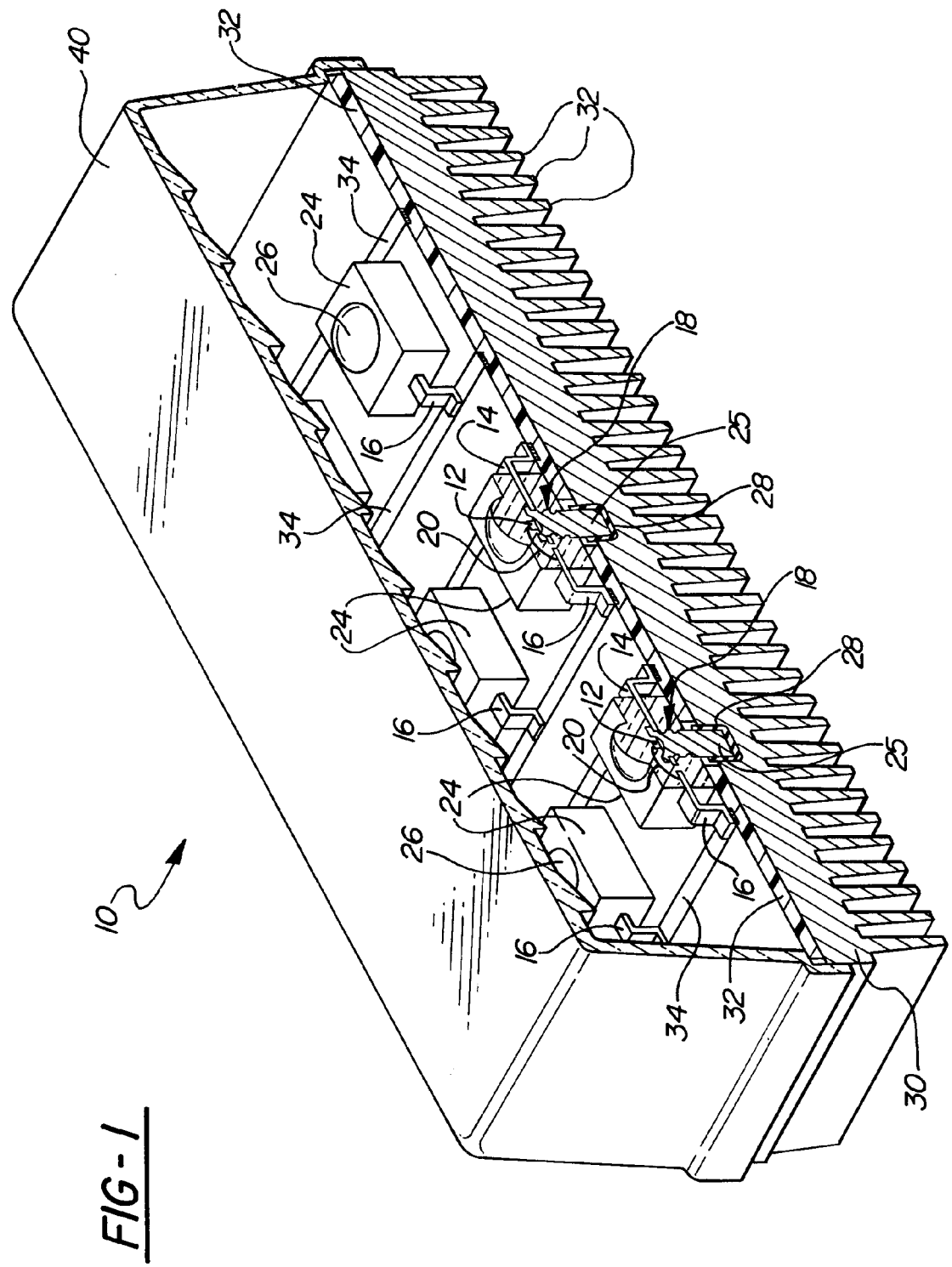
FIG. 1 is a perspective view, cut away and in cross section of a preferred embodiment.

Referring to the Figures, wherein like numerals indicate like or corresponding parts throughout the several views, an electrically driven light emitting diode (LED) assembly is generally shown at 10 in FIG. 1.

The assembly 10 comprises a plurality of light emitting diodes 12 and first 14 and second 16 electrical leads for conducting electricity to and from the light emitting diodes 12. The assembly 10 also includes a heat sink, generally indicated at 18, for each diode 12.

The assembly 10 is characterized by the first lead 14 including a heat sink 18 for conducting electricity and heat from the light emitting diode 12 through the heat sink 18. The first lead 14 conducts thermal energy away from the light emitting diode 12 at a greater rate than the second lead 16. The first lead 14 has a greater capacity for thermal energy than the second lead 16; e.g., the first lead 14 may have a greater cross-sectional area in the direction transverse to the flow of thermal energy than the second lead 16. In addition, the first lead 14 may consist of a material having a greater thermal capacity than the material comprising the second lead 16.

The light emitting diode 12 is disposed on the heat sink 18 and the first lead 14 is in electrical contact with the heat sink 18 and the second lead 16 being in electrical contact with the light emitting diode 12. In other words, the first electrical lead 14 is in series with the heat sink 18 whereas the second electrical lead 16 is in electrical conductivity with the diode 12. A short jumper lead 20 forms a length of the second lead 16 and is more wire-like than the remaining second lead 16 that may be self-sustaining copper.

Figure 2:
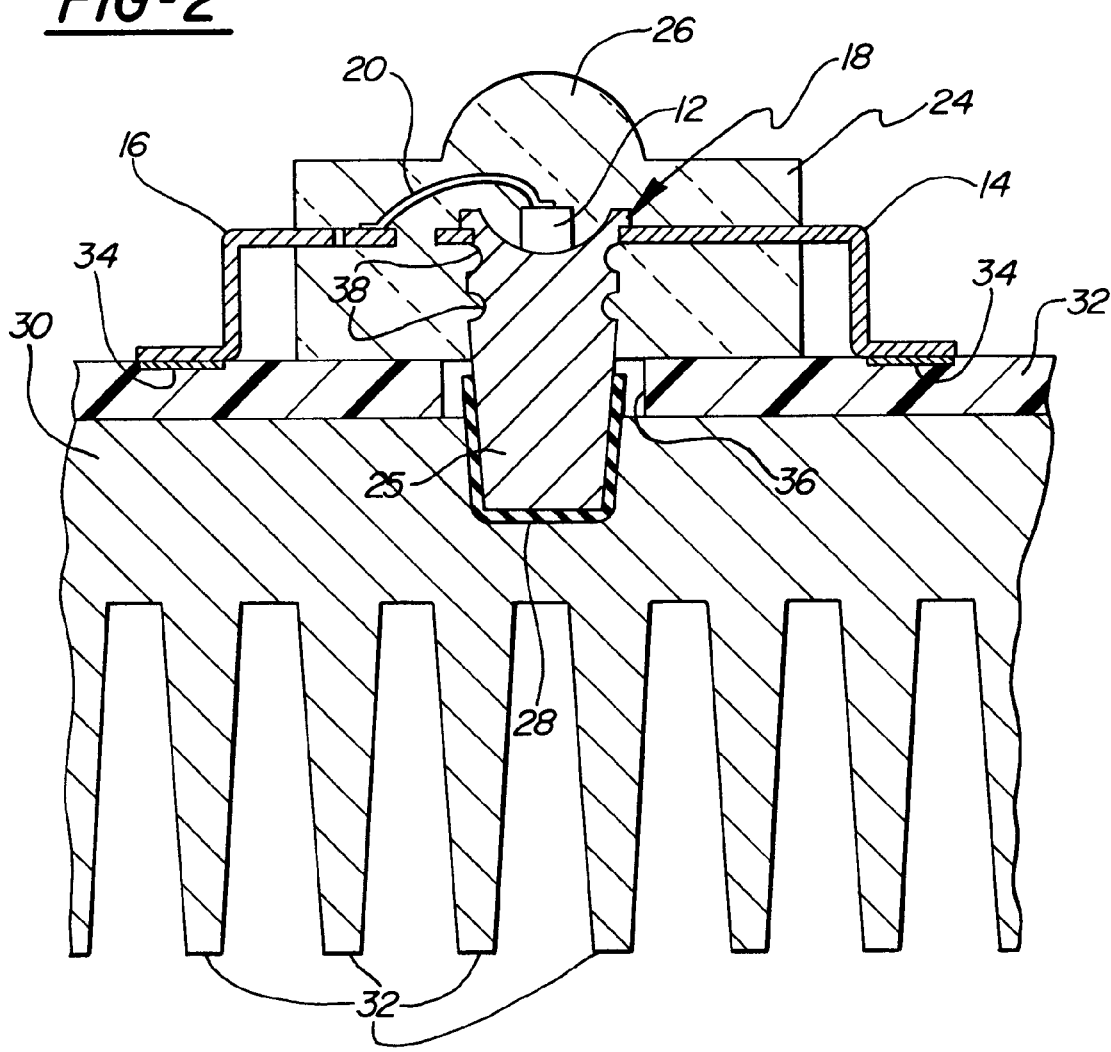
FIG. 2 is an enlarged fragmentary and cross sectional view of a section of FIG. 1.
Figure 3:
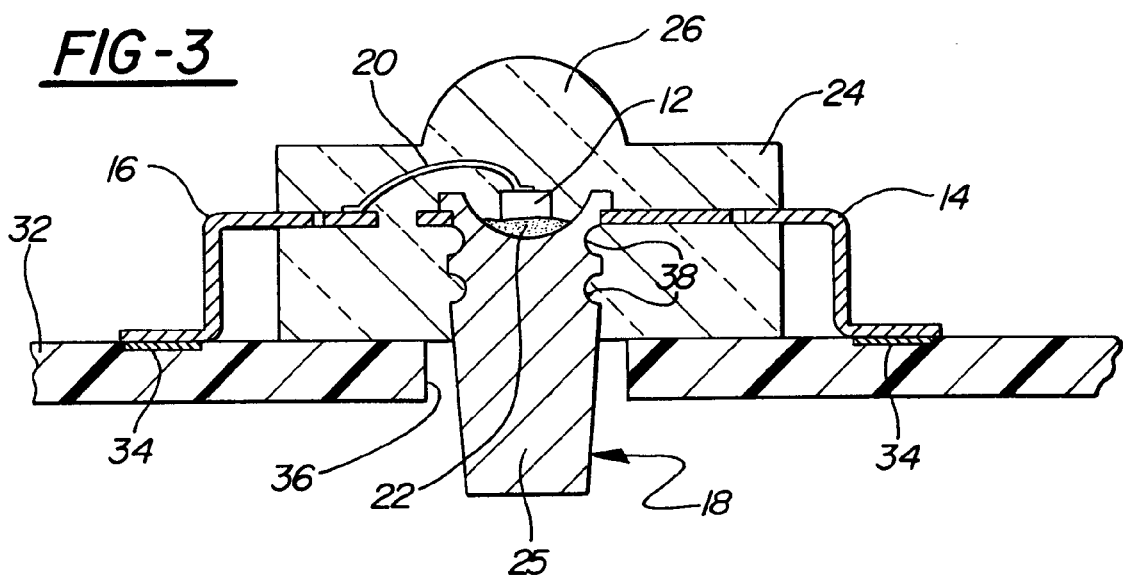
FIG. 3 is an enlarged fragmentary and cross sectional view of a section of an alternative embodiment.

Although the diode 12 may be in direct contact with the heat sink 18, as illustrated in FIG. 2, it is sometimes convenient to secure the diode 12 to the heat sink 18 by an electrically and thermally conductive adhesive 22 for securing the light emitting diode 12 to the heat sink 18, as illustrated in FIG. 3. Ultimately, an optical body 24 encapsulates the light emitting diode 12 and at least a portion of the leads 14, 16 and the heat sink 18. The body 24 is preferably an epoxy molded about the diode 12, a length of the electrical leads 14 and 16 and a portion of the heat sink 18. In this manner, the electrical leads 14 and 16 extend from the epoxy body 24 and the heat sink 18 includes an extension 25 extends from the epoxy body 24. Once the epoxy body 24 is molded about the components, it holds the diode 12 in position on the heat sink 18. The body 24 is molded to include a lens 26 for transmitting and/or focusing light generated by the light emitting diode 12.

In the first embodiment of FIGS. 1 and 2 and as alluded to above, the heat sink 18 includes an extension 25 extending from the body 24 and an electrical insulator 28 surrounds the extension 25 for conducting thermal energy from the heat sink 18 to a heat dissipater 30 in contact with the insulator 28. The heat dissipater 30 is a heat sink of much larger thermal heat capacity and may include fins 32 for radiating heat to the ambient air. In any case, it is important that the heat sink 18 be in highest thermal heat transfer relationship with the heat dissipater 30 as possible without being in electrical conductivity with the heat dissipater 30. Accordingly, the electrical insulator 28 is of high thermal conductivity while preventing electrical conductivity between the heat sink 18 and the heat dissipater 30. In other words, the heat dissipater 30 is disposed adjacent the circuit board 32 and the thin electrical insulator 28 surrounds the extension 25 and contacts the heat dissipater 30 for conducting thermal energy from the heat sink 18 to the heat dissipater 30 for preventing electrical conduction between the heat sink 18 and the heat dissipater 30.

As is well known in the art, the assembly 10 includes a circuit board 32 with circuit traces 34 thereon and the leads 14 and 16 are in electrical contact with the traces 34. The circuit board 32 has an opening 36 therein and the extension 25 of the heat sink 18 extends through the opening 36 and is in spaced relationship to the to the circuit board 32 defining the opening 36.

The components are enclosed by a transparent or translucent cover 40 sandwiched together with the circuit board 32 and the heat dissipater 30, e.g., the taillight of an automotive vehicle.

The invention also includes a method of fabricating an electrically driven light emitting diode (LED) assembly including a light emitting diode 12 with first 14 and 16 second electrical leads for conducting electricity to and from the light emitting diode 12 and a heat sink 18 wherein the method comprises the step of disposing the heat sink 18 in electrical series with the first lead 14 for conducting electricity and heat from the light emitting diode 12 through the heat sink 18.

The method includes the further steps of disposing the light emitting diode 12 on the heat sink 18, disposing the first lead 14 in electrical contact with the heat sink 18 and disposing the second lead 16 in electrical contact with the light emitting diode 12. The method may be further defined by securing the light emitting diode 12 to the heat sink 18 by the electrically and thermally conductive adhesive 22. Yet another step is the encapsulating of the light emitting diode 12 and at least a portion of the leads 14 and 16 and the heat sink 18 in an optical body 24. In so doing, the method may also include the step of forming a lens 26 in the optical body 24 for transmitting light generated by the light emitting diode 12.

The method includes the step of extending the heat sink 18 from the body 24 and disposing an electrical insulator 28 on the extension 25 for conducting thermal energy from the heat sink 18 to a heat dissipater 30 in contact with the insulator 28 while preventing electrical conductivity between the heat sink 18 and the heat dissipater 30. During the fabrication method, the leads 14 and 16 are disposed in electrical contact with traces 34 on the circuit board 32 having an opening 36 therein with the extension 25 of the heat sink 18 extending through the opening 36 and in spaced relationship to the to the circuit board 32. The fabrication also includes the steps of disposing the heat dissipater 30 adjacent the circuit board 32, disposing the thin electrical insulator 28 between the extension 25 and the heat dissipater 30 for conducting thermal energy from the heat sink 18 to the heat dissipater 30 while preventing electrical conduction between the heat sink 18 and the heat dissipater 30.

Unlike the prior art, the present invention employs a single metallic lead 14 in thermal and electrical contact with the LED die 12. That is, for LED families where the die base is the cathode connection to the diode 12, the metal heat sink, e.g., post, becomes a cathode connection. One or more electrical input leads 14 and 16 to the diode 12 are manufactured of a material and of dimensions to provide substantially higher thermal impedance than the primary heat flow path through the heat sink. Heat is preferentially driven through the heat sink element rather than the electrical input leads. Of course, since heat flow is bilateral, soldering of the relatively higher thermal resistance leads will not allow any substantial, damaging heat to flow into the die of the diode 12 and its attachment epoxy. There is no intervening electrical isolation element between the LED die 12 and the heat sink 18.

Some LEDs utilize a diode 12 that incorporate an integral sapphire or alumna insulation substrate, essential to the fabrication of the die, which is bonded to the lead frame conventionally. It is the intention of the present invention to specifically include such intrinsically isolated LED die, but require two wire die attachments rather than one. That is, the invention does not interpose any isolation means between the heat sink 18 and the LED die 12, even though the construction of the die 12 is such so as to include an intrinsic insulator.

In order to secure electrical isolation of the heat sink 18 integral to the diode 12, when bulk semiconductor die are used, the present invention utilizes an external insulation 28 that is positioned between the diode 12 and the metallic heat dissipater 30 to which the diode 12 is thermally coupled. This electrical isolator 28 is as thermally conductive as possible and as such is preferentially thin. Typically, this insulation 28 may consist of an organic coating on the exterior of the extension 25 of the heat sink 18. High temperature phonemic epoxies or loaded epoxy coatings are suitable insulators as they are physically tough, adherent and exhibit moderately high thermal conductance in thin coatings (typically under 200 microns).

Another insulation modality is the use of thin conformal sleeves that surround the heat sink 25, such sleeves may be formed of thin polyamide or other suitable plastic which can provide the desired electrical isolation while interfering minimally with heat flow from the heat sink 18 to the heat dissipater 30. This heat sink 18 to heat dissipater 30 interface is a critical element in the practical application of the present invention and must be optimized for thermal conduction. Well known means of improving the thermal conduction from the (insulated) heat sink 18 to the metallic heat dissipater 30 may be used advantageously include thermal coupling grease, thermally conductive epoxies, pressure mounting, visco-elastic thermal pads or even low melting point alloys. In all cases, the objective is the replacement of voids (typically air) with a solid, liquid or gel medium that exhibits better thermal conduction than an uncoupled system. The obvious advantage of using external insulation means for the heat sink 18 when necessary, is very low cost with a practical thermal performance virtually equivalent to diamond insulated LEDs.

Inorganic insulating coatings applied to the interface of the heat sink 18 and the metallic dissipater 30 are also practical. In cases where the heat sink 18 is fabricated of aluminum or aluminum alloy, an anodically applied insulating coating (anodizing) may be used to provide the desired thermal conductivity and electrical isolation. However, any electrical isolation coating or film insulator 28 may be applied to either the metallic heat dissipater 30 or the heat sink 18.

As alluded to above, an over-molded optical epoxy 24 may be used to secure the heat sink 18, the electrical leads 14, 16 and the integral (molded) lens 26 in correct spacial relationship. Small holes in the metallic leads 14, 16 and undercuts or grooves 38 on the heat sink 18 allow the epoxy molding compound 24 to secure all the components 12, 14, 16, 18 and 20 in a rugged singular module. Separate wire die bond and cathode (cup) connections may be provided or only one anode die bond wire may be used in conjunction with a connection to the electrically active heat sink 18. Welding, coining or staking could make such a connection between the high thermal impedance lead and the low thermal impedance heat sink 18. Alternatively, in certain applications the electrically active heat sink 18 could serve as the sole cathode connection to the diode 12 thereby allowing only one other normal electrical lead to be used. That is, the heat sink 18 could also serve as the sole electrical connection. Naturally, the circuit traces 34 and heat sink mounting area on the heat dissipater 30 would have to be electrically isolated.

Obviously, many modifications and variations of the present invention are possible in light of the above teachings. The invention may be practiced otherwise than as specifically described within the scope of the appended claims, wherein that which is prior art is antecedent to the novelty set forth in the "characterized by" clause. The novelty is meant to be particularly and distinctly recited in the "characterized by" clause whereas the antecedent recitations merely set forth the old and well-known combination in which the invention resides. These antecedent recitations should be interpreted to cover any combination in which the incentive novelty exercises its utility. In addition, the reference numerals in the claims are merely for convenience and are not to be read in any way as limiting.

What is claimed is:

1. An electrically driven light emitting diode (LED) assembly comprising;
    a light emitting diode (12),
    first (14) and second (16) electrical leads for conducting electricity to and from said light emitting diode (12),
    a heat sink (18) having an extension (25),
    said first lead (14) including said heat sink (18) for conducting electricity and heat from said light emitting diode (12) through said heat sink (18), and
    an electrical insulator (28) surrounding said extension (25) for conducting thermal energy from said heat sink (18) to a heat dissipater (30) in contact with said insulator (28).

2. An assembly as set forth in claim 1 wherein said first lead (14) conducts thermal energy away from said light emitting diode (12) at a greater rate than said second lead (16).

3. An assembly as set forth in claim 1 wherein said first lead (14) has a greater capacity for thermal energy than said second lead (16).

4. An assembly as set forth in claim 1 wherein said first lead (14) has a greater cross-sectional area than said second lead (16).

5. An assembly as set forth in claim 1 wherein said first lead (14) comprises a material having a greater thermal capacity than the material comprising said second lead (16).

6. An assembly as set forth in claim 1 wherein said light emitting diode (12) is disposed on said heat sink (18), said first lead (14) being in electrical contact with said heat sink (18) and said second lead (16) being in electrical contact with said light emitting diode (12).

7. An assembly as set forth in claim 6 including an electrically and thermally conductive adhesive (22) securing said light emitting diode (12) to said heat sink (18).

8. An assembly as set forth in claim 6 including an optical body (24) encapsulating said light emitting diode (12) and at least a portion of said leads and said heat sink (18).

9. An assembly as set forth in claim 8 wherein said body (24) includes a lens (26) for transmitting light generated by said light emitting diode (12).

10. An assembly as set forth in claim 8 wherein said extension (25) extends from said body (24).

11. An assembly as set forth in claim 8 including a circuit board (32) and circuit traces (34) thereon, said leads (14 and 16) being in electrical contact with said traces (34), said circuit board (32) having an opening (36) therein, said heat sink (18) having an extension (25) extending through said opening (36) and in spaced relationship to said to said circuit board (32).

12. An assembly as set forth in claim 11 including a heat dissipater (30) disposed adjacent said circuit board (32), a thin electrical insulator (28) surrounding said extension (25) and contacting said heat dissipater (30) for conducting thermal energy from said heat sink (18) to a heat dissipater (30) and for preventing electrical conduction between said heat sink (18) and said heat dissipater (30).

13. A method of fabricating an electrically driven light emitting diode (LED) assembly including a light emitting diode (12) with first (14) and second (16) electrical leads for conducting electricity to and from said light emitting diode (12) and a heat sink (18), said method comprising the steps of;
    disposing the heat sink (18) in electrical series with the first lead (14) for conducting electricity and heat from said light emitting diode (12) through the heat sink (18), and extending the heat sink (18) and disposing an electrical insulator (28) on the extension (25) for conducting thermal energy from the heat sink (18) to a heat dissipater (30) in contact with said insulator (28) while preventing electrical conductivity between the heat sink (18) and the heat dissipater (30).

14. A method as set forth in claim 13 including disposing the light emitting diode (12) on the heat sink (18), disposing the first lead (14) in electrical contact with the heat sink (18) and disposing the second lead (16) in electrical contact with the light emitting diode (12).

15. A method as set forth in claim 14 including securing the light emitting diode (12) to the heat sink (18) by an electrically and thermally conductive adhesive (22).

16. A method as set forth in claim 15 including encapsulating the light emitting diode (12) and at least a portion of the leads (14 and 16) and the heat sink (18) in an optical body (24).

17. A method as set forth in claim 16 including forming a lens (26) in the optical body (24) for transmitting light generated by the light emitting diode (12).

18. A method as set forth in claim 16 including disposing the leads (14 and 16) in electrical contact with traces (34) on a circuit board (32) having an opening (36) therein with the extension (25) extending through the opening (36) and in spaced relationship to the to the circuit board (32).

19. A method as set forth in claim 18 including disposing a heat dissipater (30) adjacent the circuit board (32), disposing a thin electrical insulator (28) between the extension (25) and the heat dissipater (30) for conducting thermal energy from the heat sink (18) to the heat dissipater (30) for preventing electrical conduction between the heat sink (18) and the heat dissipater (30).

* * * * *